United States Patent [19]

Brouwer et al.

[11] 4,260,566
[45] Apr. 7, 1981

[54] STRAND SHIELD DEFECT DETECTOR

[75] Inventors: Nicholaas L. Brouwer, Washington Township, Armstrong County; Louis H. Dreinhoefer, Murrysville, both of Pa.

[73] Assignee: Aluminum Company of America, Pittsburgh, Pa.

[21] Appl. No.: 87,709

[22] Filed: Oct. 24, 1979

[51] Int. Cl.³ ............................................. B29F 3/10
[52] U.S. Cl. .................................... 264/22; 264/40.2; 264/174; 324/52; 324/54; 425/113; 425/163; 425/169; 425/174.6; 425/174.8 R
[58] Field of Search ...................... 264/40.2, 174, 40.1, 264/22, 27; 425/163, 113, 169, 174.8 R, 174.6, 174; 324/54, 52

[56] References Cited

U.S. PATENT DOCUMENTS

| 2,422,288 | 6/1947 | Boynton | 324/54 |
| 3,096,478 | 7/1963 | Brown | 324/54 |
| 3,288,895 | 11/1966 | Windeler | 264/40.2 |
| 3,358,226 | 12/1967 | Clinton | 324/54 |
| 3,433,858 | 3/1969 | Bauer et al. | 264/40.2 |
| 3,710,241 | 1/1973 | Dineen | 324/54 |
| 3,841,810 | 10/1974 | Robinson et al. | 425/169 |

Primary Examiner—Jeffery R. Thurlow
Attorney, Agent, or Firm—Elroy Strickland

[57] ABSTRACT

A method and apparatus for detecting imperfections in a semi-conductive strand shield applied to an electrical conductor. The method comprises the steps of applying AC current between a bare portion of the conductor and apparatus applying a jacket of insulating material over the strand shield, as the conductor and shield move through the apparatus. The current and the voltage applying the current are measured to determine the impedance of the circuit of the conductor and apparatus applying the insulating jacket. Changes in the impedance are then monitored, such changes being indicative of changes in the quality of the strand shield applied to the conductor.

2 Claims, 2 Drawing Figures

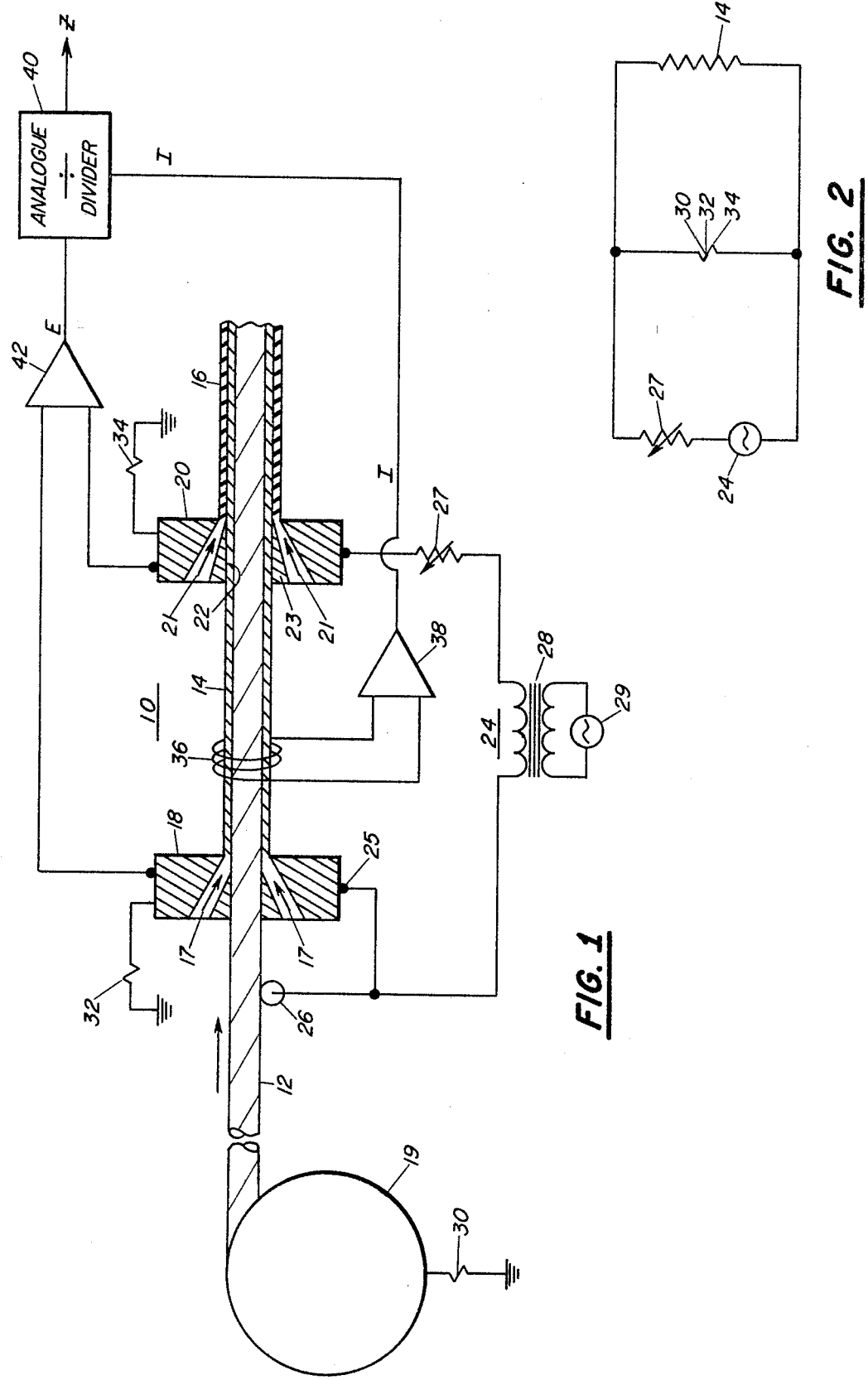

STRAND SHIELD DEFECT DETECTOR

BACKGROUND OF THE INVENTION

The present invention relates generally to insulated, high voltage electrical conductors of the type provided with an intermediate layer of semi-conducting material otherwise known as a strand shield.

In the manufacture of insulated electrical conductors, a strand shield, i.e. a layer of semi-conductive material, is applied over a bare conductor before an outside jacket of insulating material is applied over the strand shield. The purpose of a shield is to minimize the creation of voltage gradients about and along the conductor caused by surface imperfections such as protrusions on the conductor surface. This can result in corona and deterioration of the dielectric properties of the insulation. The strand shield functions to negate such results by providing an equal potential field along and about the conductor.

A strand shield may be applied to the bare conductor by way of a head device capable of concentrically extruding semi-conductive material in a plastic state on the bare conductor, as the bare conductor moves concentrically through the head device. The strand shield and conductor then receive a jacket of insulating material, which is applied by a second extruding head located around or downstream from the head that applies the strand shield. Defects in the strand shield occur mostly in the second extruding head, and are caused by non-uniform pressure on the shield as it passes through an extruding tip located within the head, i.e. it is difficult to maintain a uniform concentric position and consequent flow of jacket material about the shield and conductor as they pass through the head applying the jacket material. The result of this is that the conductor and strand shield tend to move off center within the tip such that pressure is concentrated within the tip on the shield, and the shield tends to engage the tip, which damages and/or removes the strand shield from the conductor.

A device for detecting defects in strand shields is disclosed in U.S. Pat. No. 3,841,810 to Robinson et al, this patent disclosing the use of a direct current (DC) voltage applied between the conductor and the tip of the extruding head. The tip is electrically insulated from the remainder of the head and the extruding apparatus and machinery. Current flow in the conductor that might be caused by a break or other defect in the strand shield is measured by a resistance bridge circuit connected across the DC source and between the conductor and the insulated tip.

BRIEF SUMMARY OF THE INVENTION

The present invention is directed to a circuit arrangement and method in which an AC current source is simply connected, i.e. clamped, between a bare portion of a conductor receiving a strand shield and the most available electrically conductive portion of the apparatus applying an insulating jacket on the strand shield to determine the integrity of the strand shield. Little or no current flows in the conductor between the two locations at which the current source is connected when the shield has no defects. Rather, current flows through ground paths which include the apparatus applying the shield and jacket. When a defect occurs in the strand shield, however, a path parallel to ground is established in the conductor, which path conducts a minor or substantial portion of the current originally flowing in the ground paths, depending upon the impedance of the strand shield as it exits between the tip and conductor. This current is sensed to provide an indication of the defect in a manner described in detail hereinafter.

THE DRAWING

The invention, along with its objectives and advantages, will best be understood from consideration of the following detailed description and the accompanying drawing in which:

FIG. 1 is a diagrammatic representation of the apparatus and circuit arrangement of the invention; and FIG. 2 is a schematic circuit diagram greatly simplifying the arrangement shown in FIG. 1.

PREFERRED EMBODIMENTS OF THE INVENTION

Referring now to the drawing, a system 10 is shown for measuring the impedance to current flow in a conductor 12 being coated with a strand shield 14 of semi-conductive material, and an outer jacket of electrical insulating material 16. The strand shield is shown being applied to a bare conductor 12 in a first extrusion process involving a head 18, 18 being a part and representative of machinery and apparatus adapted to extrude the material of the strand shield on the bare conductor. Arrows 17 in the drawing indicate schematically the flow of material in the head 18 of this process. The bare conductor may be stored on a reel 19 and pulled therefrom by suitable means (not shown) and in a manner well known in processes for applying strand shields and insulating jackets.

The bare conductor 12 and shield 14 travel from extruder 18 to and through a second extruding head 20 located downstream from 18, head 20 being representative and part of the overall apparatus for applying insulating jacket 16.

Shielded conductor 14 enters and passes through the opening 22 of an appropriate tip 23 located in head 20 to receive jacket 16, the flow of the jacket material being indicated generally by arrows 21 in head 20. It is in this process, as indicated earlier, that defects in the strand shield occur, though at much less probability defects might also occur at locations behind head 20. The detection means 10 of the present invention will indicate defects occurring before 20 as well as those caused by 20.

The strand shield tends to be damaged in tip 23 because of certain problems associated with 20. More particularly, the pressure at which the material of jacket 16 is applied tends to be non-uniform about the strand shield such that the conductor and shield are forced to one side of 22 in the process of passing through the tip. This concentrates and localizes extruding pressure on the strand shield, and the shield may actually contact and rub against the inside of 22, which can break and remove shield material from the conductor, especially if solid particulate is present in the extrudate.

In addition, if the pulling force or tension of the take-up process undergoes an abrupt change, which causes the conductor to momentarily back through the extruder, the strand shield can be damaged or broken in tip 23 by extrudate buildup in the tip.

And finally, if the thickness of the shield applied at 18 is somewhat excessive, the shield bunches up as it enters tip opening 22 of the extruder to cause thinning out and/or removal of the material of the strand shield.

To detect defects in the strand shield caused by such occurrences in an effective, convenient and low cost manner, the circuit arrangement 10 of the invention is provided. Initially, a portion of circuit 10 comprises a low voltage, high current AC source 24 of electrical energy applied between a bare portion of conductor 12 and the apparatus 20 for applying outer jacket 16. Hence, one terminal of source 24 is connected to conductor 12 at a location before the strand shield 14 is applied to the conductor. This can be accomplished by simply clamping one terminal of the source to extruding apparatus 18, as indicated by connection 25 in the drawing, or by a roller contacting means 26 disposed in physical and electrical contact with a bare portion of the conductor, as shown in the drawing. To insure good electrical contact, both connections may be employed.

The other terminal of 24 is connected, i.e. simply clamped, to the extrusion apparatus 20 through a variable impedance device 27. The variable impedance limits current flow in the circuit of the source 24 such that the amount of such current flow is made consistent with the rating of 24.

Source 24, in further reference to the drawing, may be the secondary winding of a transformer 28 having its primary winding connected to a source 29 of AC voltage, such as the 60 cycle, 120 or 220 volt, house or plant potential. Transformer 28 steps down the voltage applied across the primary to about 2 volts across the second winding, and thereby increases the amount of available current, in essentially the same inverse proportion. The frequency of the energy in the secondary is the same as that of the primary, of course, but is not limited to that of house current, as the system of the invention is not limited to the use of house current. What is required is an AC current source of a magnitude sufficient to provide current flow in the circuit of the conductor between the two extrusion devices with the occurrence of a defect in the strand shield, which current is at least a portion of that flowing in ground paths that exist across the current source in a manner presently to be explained.

The apparatus 18 and 20 for applying jackets 14 and 16 (respectively) to conductor 12, and spool 19 containing bare conductor, are grounded and are usually housed in a metal building such that there are low impedance paths for conducting electrical current parallel to that provided by conductor 12 extending between extrusion apparatus 18 and 20. These low impedance paths are indicated schematically by resistances 30, 32 and 34 in FIG. 1 connecting reel 19 and extrusion apparatus 18 and 20 respectively to ground. In FIG. 2, these paths are represented by a single, physically small resistor bearing the same numerical references. The amount of the resistance of these impedance paths is on the order of one-tenth of one ohm or less.

Hence, the need for a source of current that will provide increased current flow in a path parallel to the ground paths, i.e. in the conductor 12, when an imperfection occurs in strand shield 14 on the conductor. Without imperfections in strand shield 14, current flow in the circuit of 24 and in the ground paths is high while the flow of current in conductor 12 between 18 and 20 is minimal because the total impedance of the circuit, i.e. the inductive and capacitive reactance and resistance components of the strand shield are high compared to the components of the ground paths. In FIG. 2 the circuit of the strand shield is shown as a large (physically) resistance 14. The total impedance of this circuit comprises that of (1) strand shield 14, (2) the variable impedance device 27, (3) transformer 28 and (4) any impedance existing between the bare conductor and its connection to the secondary winding of the transformer.

However, the minimal current flow in the circuit of conductor 12 and 14 changes when the thickness of the strand shield changes in a significant manner. Any such change must be detected between points 18 and 20 by a current sensing means disposed in sensing relationship with the conductor because there is no current flow in the direction of the takeup of the conductor, as the conductor is now insulated as it is collected on an appropriate reel or spool structure (not shown).

In the drawing, the current sensing means is shown as a toroidal winding 36 spaced from but located around the shielded conductor. Such a toroidal device, which does not contact the shield and conductor, is necessary since the conductor cannot be broken to receive directly a current reading meter in electrical series, i.e. the application of the strand shield and the insulating jacket is a continuous production process that does not allow the stopping of the process to cut the conductor and to insert a current sensing meter, or other such means, between the cut portions.

Current flow in the conductor and shield produces a magnetic field about the conductor and shield which induces current flow in toroid 36. A significant change in the amount of current flowing in the conductor changes the force of the magnetic field which changes the amount of current (I) induced in 36. This current change is amplified by a suitable amplifier 38, the output of which is directed to a conventional analogue divider 40. The analogue divider, using ohm's law $(Z=(E/I))$, calculates precisely the impedance Z of the circuit of the conductor to provide a readout that is indicative of a change in the quality of shield 14. The voltage E for the calculation performed by the analogue divider is provided by measuring the voltage applied to the bare conductor and extrusion apparatus 20 which is amplified by a voltage amplifier 42. As shown in FIG. 1, 42 is connected to 18 and 20.

When the thickness of strand shield 14 decreases critically, because of increased tip pressure and finally contact with the conductor, the current flowing in the ground paths parallel to conductor 12 is at least partially diverted through 14 to 12, as the impedance of the shield to the flow of current in the conductor is substantially reduced by the contact. When the conductor 12 physically contacts the inside surface 22 of tip 23 of the extruder tip, the impedance offered by the shield is completely removed from the circuit of the conductor.

The detector of winding 36 immediately senses the increased current flow in the conductor, and outputs an indication of this increase to amplifier 38 and analogue divider 40. With voltage E remaining essentially constant, the impedance (Z) of the circuit of the conductor is substantially reduced, i.e. current I is the denominator in the above equation for calculating impedance Z. An alarm can now be activated and/or a record made of the location of the break in the conductor product.

The ability to connect a source of measuring current directly to extruding apparatus employed to apply a strand shield and insulating jacket to a conductor eliminates the need to insulate the tips of the apparatus employed in applying the insulating jacket. This results in a considerable reduction in capital investment, as there are many sizes of tips required for the different sizes of insulated conductor, all of which must be insulated if the concept of the present invention is not used.

Another advantage of the invention is the fact that a calculated impedance measurement is a linear function. This allows ease in handling different strand shield compounds, wall thickness and conductor diameters.

While the invention has been described in terms of preferred embodiments, the claims appended hereto are intended to encompass all embodiments which fall within the spirit of the invention.

What is claimed is:

1. A method of detecting imperfections in a semi-conducting strand shield as it is being applied to an electrical conductor, the method comprising the steps of:

applying an AC electrical potential between a bare location of the conductor and apparatus applying a jacket of insulating material over the strand shield after the shield has been applied to the conductor, as the conductor and shield move through the apparatus, the bare conductor and apparatus providing low impedance paths for current flow parallel to a path for current flow provided by the strand shield and the conductor with the strand shield, measuring the electrical potential applied to the bare conductor and apparatus applying the jacket of insulating material, and current flow, if any, through the strand shield and conductor with the strand shield due to a defect in the shield in a manner that permits continuing travel of the shield and conductor, calculating the resultant impedance to the flow of current in the strand shield and conductor with the shield, and sensing changes in the resultant impedance, such changes being caused by a defect in the strand shield applied to the conductor.

2. In combination, means for applying a strand shield to an electrical conductor, the strand shield and conductor with the shield providing a path for the flow of electrical current, apparatus for extruding an insulating jacket over the strand shield, means adapted to provide a relatively high current, low voltage, AC source of energy, means for applying said energy between a bare portion of the conductor and the apparatus for extruding the insulating jacket, said means for applying the strand shield and insulating jacket providing paths for current flow parallel to the path provided by the strand shield and conductor with the shield, means to measure the applied voltage and resultant current flow in the conductor and shield in a manner that permits continuous travel of the conductor and shield, means to process the above measurements and calculate the impedance to the flow of current by dividing the measurement of applied voltage by the measurement of current flow in the strand shield and conductor with the shield, and means to sense changes in said impedance, said changes being indicative of changes in the quality of the strand shield applied to the conductor.

* * * * *